United States Patent
Bolouri-Saransar et al.

(10) Patent No.: US 9,698,547 B2
(45) Date of Patent: Jul. 4, 2017

(54) BACKWARD COMPATIBLE CONNECTIVITY FOR HIGH DATA RATE APPLICATIONS

(71) Applicant: Panduit Corp., Tinley Park, IL (US)

(72) Inventors: Masud Bolouri-Saransar, Orland Park, IL (US); Surendra Chitti Babu, New Lenox, IL (US); Paul W. Wachtel, Arlington Heights, IL (US); Ronald A. Nordin, Naperville, IL (US)

(73) Assignee: Panduit Corp., Tinley Park, IL (US)

( * ) Notice: Subject to any disclaimer, the term of this patent is extended or adjusted under 35 U.S.C. 154(b) by 34 days.

(21) Appl. No.: 14/608,695

(22) Filed: Jan. 29, 2015

(65) Prior Publication Data

US 2015/0171576 A1 Jun. 18, 2015

Related U.S. Application Data

(63) Continuation of application No. 13/632,211, filed on Oct. 1, 2012, now Pat. No. 8,944,855.

(Continued)

(51) Int. Cl.
| | |
|---|---|
| *H01R 24/00* | (2011.01) |
| *H01R 24/62* | (2011.01) |
| *H01R 13/6461* | (2011.01) |
| *H01R 13/658* | (2011.01) |
| *H01R 13/66* | (2006.01) |
| *H01R 13/703* | (2006.01) |

(Continued)

(52) U.S. Cl.
CPC ......... *H01R 24/62* (2013.01); *H01R 13/6461* (2013.01); *H01R 13/658* (2013.01); *H01R 13/6658* (2013.01); *H01R 13/703* (2013.01); *H01R 24/64* (2013.01); *H01R 27/00* (2013.01); *H01R 29/00* (2013.01); *H01R 2107/00* (2013.01); *H05K 1/0228* (2013.01); *H05K 1/0239* (2013.01); *H05K 2201/10189* (2013.01)

(58) Field of Classification Search
CPC H01R 23/025; H01R 13/6658; H01R 13/658; H05K 1/0228
USPC .......................... 439/676, 76.1, 941
See application file for complete search history.

(56) References Cited

U.S. PATENT DOCUMENTS

| | | | |
|---|---|---|---|
| 3,354,355 A | 11/1967 | Cliffgard et al. | |
| 4,679,879 A * | 7/1987 | Triner .................... | H01R 12/79 439/425 |

(Continued)

FOREIGN PATENT DOCUMENTS

| | | |
|---|---|---|
| EP | 0739058 A1 | 4/1996 |
| WO | 2009100296 A1 | 8/2009 |

*Primary Examiner* — Hien Vu
(74) *Attorney, Agent, or Firm* — Christopher S. Clancy; James H. Williams; Christopher K. Marlow

(57) ABSTRACT

The present invention provides a communication jack for connecting to one of a first plug and a second plug. The jack includes a housing, plug interface contacts, and coupling circuitry. The plug interface contacts are at least partially within said housing and include a plurality of contact pairs having at least a first contact pair and a second contact pair. The coupling circuitry is configured for engaging said first contact pair and said second contact pair when said first plug is inserted into said housing. The coupling circuitry is configured for disengaging from said first contact pair and said second contact pair when said second plug is inserted into said housing.

6 Claims, 24 Drawing Sheets

Related U.S. Application Data

(60) Provisional application No. 61/543,866, filed on Oct. 6, 2011.

(51) Int. Cl.
  H01R 24/64 (2011.01)
  H01R 27/00 (2006.01)
  H01R 29/00 (2006.01)
  *H01R 107/00* (2006.01)
  *H05K 1/02* (2006.01)

(56) References Cited

U.S. PATENT DOCUMENTS

| | | | |
|---|---|---|---|
| 5,186,647 A * | 2/1993 | Denkmann | H01R 13/6467 439/108 |
| 6,079,996 A | 6/2000 | Arnett | |
| 6,156,981 A | 12/2000 | Ward et al. | |
| 6,244,908 B1 | 6/2001 | Hammond et al. | |
| 6,736,681 B2 * | 5/2004 | Arnett | H05K 1/0228 439/676 |
| 7,182,649 B2 * | 2/2007 | Caveney | H05K 1/0228 439/620.22 |
| 7,828,569 B2 * | 11/2010 | Aronson | H01R 27/00 439/218 |
| 7,993,166 B1 | 8/2011 | Kline | |
| 8,333,599 B2 | 12/2012 | Xu et al. | |
| 8,480,438 B2 | 7/2013 | Mattson | |
| 8,715,012 B2 * | 5/2014 | Taylor | H01R 24/64 439/676 |
| 8,795,003 B2 | 8/2014 | Mattson | |
| 2005/0059301 A1 | 3/2005 | Chou et al. | |
| 2008/0280500 A1 * | 11/2008 | Martich | H01R 13/514 439/676 |
| 2009/0108848 A1 | 4/2009 | Lundquist et al. | |
| 2010/0136848 A1 | 6/2010 | Lin et al. | |
| 2010/0173528 A1 | 7/2010 | Martich et al. | |

* cited by examiner

BACKWARD COMPATIBLE CONNECTIVITY FOR HIGH DATA RATE APPLICATIONS

CROSS-REFERENCE TO RELATED APPLICATIONS

This application is a continuation of U.S. patent application Ser. No. 13/632,211, filed Oct. 1, 2012, which will issue as U.S. Pat. No. 8,944,855 on Feb. 2, 2015, and claims priority to U.S. Provisional Application Ser. No. No. 61/543,866, filed Oct. 6, 2011, the subject matter of which is hereby incorporated by reference in its entirety.

BACKGROUND

Currently, one of the fastest communication data rates specified by the IEEE over structured copper cabling is 10 gigabit/second (Gbps) per the IEEE802.3ba standard. The structured cabling infrastructure called out in this standard is based on twisted pair cabling and RJ45 connectivity. This type of structured copper cabling specified by the IEEE includes four balanced differential pairs over which the Ethernet communication takes place. Compliant channels will also meet the TIA568 Category 6A (CAT6A) specifications for cable, connectors, and channels. These CAT6A components and channels provide 500 MHz of bandwidth for data communication across 100 meter links.

In June 2010, the IEEE ratified a new standard, IEEE802.3an, for high speed Ethernet communication at speeds of 40 Gbps and 100 Gbps. This new standard called for both fiber and copper media; however, the only copper media supported was a short (7 m) twin-ax based copper cable assembly. No provisions were made for twisted pair structured copper links.

The traditional benefits that come with structured copper channels such as lower cost, backwards compatibility, and field terminable connectivity, are still desirable at higher speeds such as 40 and 100 Gbps. This has prompted many in the industry to investigate the feasibility of transmitting 40 Gbps over a structured copper channel. Some have speculated that higher bandwidth (1000 MHz) Category 7a (CAT7A) cables and connectivity can support 40 Gbps transmission. To achieve 1000 MHz of bandwidth in a mated connector, a fundamental change in architecture is required. Traditional RJ45 connectivity presents four pairs of contacts arranged in a parallel 1-8 in-line fashion with one pair split around another pair. With this arrangement of conductors, substantial technical challenges related to crosstalk, mode conversion, and return loss arise when the bandwidth is extended to 1000 MHz. Two different CAT7A solutions to these connectivity challenges have been accepted in the industry.

The IEC 61076-3-104 specification details one architecture that isolates the 4 pairs of contacts into individual shielded "quadrants" which allows for a more manageable approach to minimizing crosstalk and mode conversion at 1000 MHz. A fundamental drawback to at least one type of this design can be that it sacrifices one key benefit of structured copper cabling, backward compatibility, as RJ45 plugs are not compatible with 61076-3-104 type connectors.

Another connectivity solution specified in IEC 60603-7-71 incorporates two "modes" of operation to allow for backward compatibility with RJ45 style plugs, and a higher bandwidth style plug, sometimes referred to as "ARJ45", with 4 pairs of contacts isolated in "quadrants". An IEC 60603-7-71 type of connector design is much more electrically and mechanically challenging than the 61076-3-104 style connector, but it does maintain the key feature of backward compatibility. When mated with an RJ45 plug, the connector must provide the necessary electrical crosstalk compensation to comply with the RJ45 rated standard such as CAT6A. When mated with a 60603-7-71 plug, the connector must provide the corresponding isolated contact locations. The dual mode functionality is achieved by sharing the two outermost pairs of RJ45 contacts, grounding the middle two pairs of RJ45 contacts, and providing two new pairs of isolated contacts. In total there are six pairs of contacts in the connector, four of which are used depending on which style plug it is mated with. The presence of these extra pairs and the mechanical flexibility of the connector results in a very challenging electrical design due to potential parasitic coupling between unused contacts and/or unwanted compensation circuitry. By sharing the two outermost pairs of RJ45 contacts, any crosstalk compensation circuitry between these pairs and the other pairs can cause an unintended imbalance leading to mode conversion and increased insertion loss through the connector when mated with a 60603-7-71 plug. Conversely, when mated with an RJ45 plug, the unused isolated contacts can provide an unintended parasitic coupling path between pairs leading to degraded crosstalk, and return loss performance.

While both CAT7A connectors previously discussed support a channel with a bandwidth of 1000 MHz, capacity analysis has shown that the channel with the previously discussed connectors can only support 40 Gbps transmission over a length of roughly 25 meters. In addition, the complexity of the electronics required to transmit and receive data is significant and may not be available at a reasonable power level for 10 years or more. A higher bandwidth channel is needed to extend the reach of a structured copper channel to a meaningful distance of 50 meters. Capacity analysis indicates that the channel bandwidth will need to approach 2 GHz to optimally support 40 Gbps transmission. In addition, improved connector crosstalk and return loss performance may be required to alleviate some of the digital signal processing burden placed on the electronics, which drives the complexity and overall power consumption of the electronics.

What is needed in the art is a higher category cable and connectivity solution that supports at least 40 Gbps transmission across a structured copper channel, and which includes backward compatibility with RJ45 connectivity.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

The present invention provides an IEC 60603-7-71 connector (jack) solution that supports two modes of operation depending on the type of plug inserted into the connector. One mode of operation is capable of supporting high speed communication over a structured copper channel at speeds beyond 10 Gbps when an IEC 60603-7-71 style plug is inserted. The electrical and mechanical design of the jack extends the usable bandwidth well beyond the IEC 60603-7-71 requirement of 1000 MHz to support potential future applications such as 40GBASE-T. In addition, a second mode of operation provides the jack with backward comp ability to all lower speed BASE-T applications such as 10GBASE-T and below when a standard RJ45 plug is inserted into the jack. The dual functionality of the jack of the present invention is enabled via a unique switching function that is activated based on the type of plug inserted into the connector.

Figure 1:
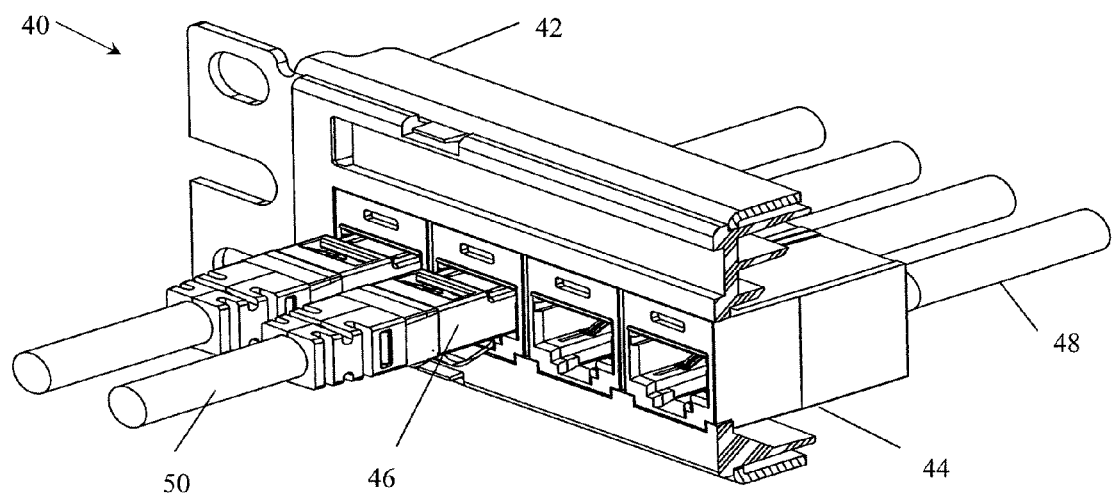
FIG. 1 depicts a perspective view of a copper structured cabling communication system, in accordance with one embodiment of the present invention.
Figure 7:
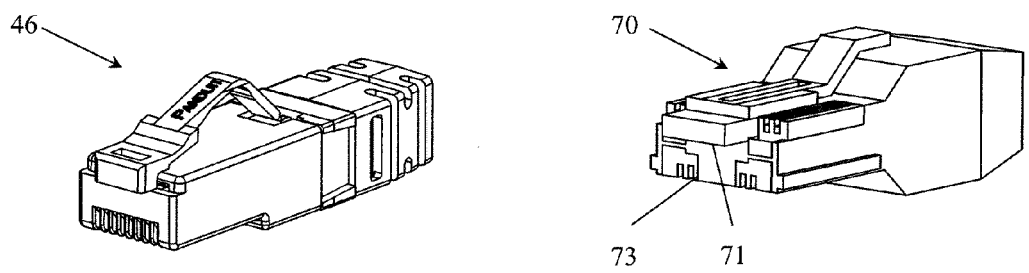
FIG. 7 depicts a perspective view of an RJ45 plug and an IEC 60603-7-71 plug, in accordance with one embodiment of the present invention.

With reference to FIG. 1, a copper structured cabling communication system 40 is shown, in accordance with the present invention, which includes a patch panel 42 having jacks 44 and RJ45 plugs 46 associated with and engaging those jacks 44. Alternatively, a 60603-7-71 type plug 70, as shown in FIG. 7, can also be used with associated cable in place of an RJ45 plug 46. The represented communication system 40 illustrates one typical application for jack 44 when used in a structured cabling environment such as a data center. A cable 48 is terminated to one end of the jack 44 and another cable 50 is terminated in a plug 46 that is inserted into the other side of the jack 44 allowing for bi-directional communication through the plug 46 and the jack 44.

Although the present invention can be used in communication system 40 as shown in FIG. 1, other communication systems according to the present invention can include equipment other than a patch panel 42. The equipment of the present invention can be passive equipment or active equipment. Examples of passive equipment can be, but are not limited to, modular patch panels, angled patch panels, and wall jacks. Examples of active equipment can be, but are not limited to, Ethernet switches, routers, servers, physical layer management systems, and Power-Over-Ethernet equipment as can be found in data centers; telecommunications rooms;

security devices (cameras and other sensors, etc.) and door access equipment; and telephones, computers, fax machines, printers and other peripherals found in workstation areas. Communication system 40 according to the present invention can further include cabinets, racks, cable management and overhead routing systems, and other such equipment.

With reference to FIGS. 2 to FIG. 6, one embodiment of the present invention includes jack 44 with a PCB 52, a front dielectric frame 54, a rear dielectric frame 56, a vertical PCB metal slider 58, a vertical spring 60, plug interface contacts (PICs) 61 (4,5), PICs 62 (1,2,3,6,7,8), PICs 63 (3',4',5',6'), insulation displacement contacts (IDCs) 64, a horizontal metal divider 66, a vertical metal divider 67 and a metal jack housing 68. Jack 44 can also include a wire cap, strain relief clip and other cable/conductor connector devices.

A switching mechanism 65, which is a combination of elements 52, 54, 56, 58, 60, 61, 62, 63, in jack 44 provides a dual functionality having compliance with an RJ45 Plug 46 and an IEC 60603-7-71 plug 70, as shown in FIG. 7, is achieved by incorporating a sliding PCB 52 that has a vertical degree of freedom and a coupling circuitry having two independent circuits 100, 102 in PCB 52 for RJ45 and IEC 60603-7-71, as shown in FIG. 3, FIG. 4, FIG. 5 and FIG. 6. The sliding PCB 52 rides on top of a spring element 60 which aids in locating PCB 52 depending on the plug inserted. Further, PCB 52 is constrained between two dielectric frames (front 54 and rear 56). Dielectric frames 54, 56 have aligning features 84, 88 along with matching feature 86 in PCB 52 to help constrain PCB 52 in a Z-direction and also provide a way for limiting the maximum vertical movement (in a −Y and +Y direction) for the PCB 52 during the insertion and withdrawal of the plugs 46, 70. Based on the type of plug inserted into the jack, either plug 46 or plug 70, PCB 52 is located at one of two possible locations which enable the switching of the signal path between jack contacts 61, 62, and 63 and one of two independent circuits 100, 102 on PCB 52.

Jack 44 is provided with twelve plug interface contacts: PICs 61 (contacts 4, 5), PICs 62 (contacts 1, 2, 3, 6, 7, 8) and PICs 63 (contacts 3', 4', 5', 6') that are held in position by the fixed front dielectric frame 54 to ensure they are aligned with their corresponding contact pads on the front side of PCB 52 and the contacts on the plug 46 or 70. Front dielectric frame 54 also has protruded cantilevered features 80, 82 that support the PICs 61, 62, 63 as they are being engaged with the plug contacts. Cantilevered features 80, 82 help provide an additional normal force for the PICs 61, 62, 63 during insertion and engagement. PICs 1 through 8 (61, 62) are arranged in a fashion to mate with a traditional RJ45 plug. The IEC 60603-7-71 style plug 70, shown in FIG. 7, is designed to provide much more isolation between the four pairs compared to an RJ45 plug 46 by creating more separation between contact pairs and providing shielding 73 between the pairs.

Figure 2:
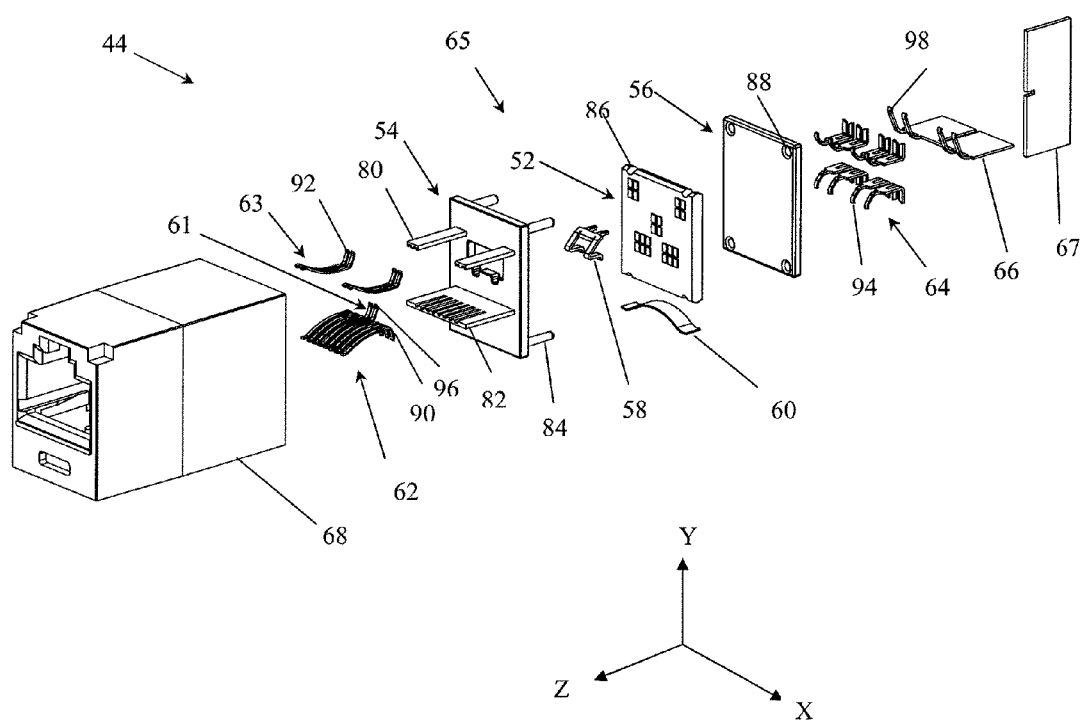
FIG. 2 depicts an exploded perspective view of a jack in a structured cabling communication system, in accordance with one embodiment of the present invention.
Figure 3:
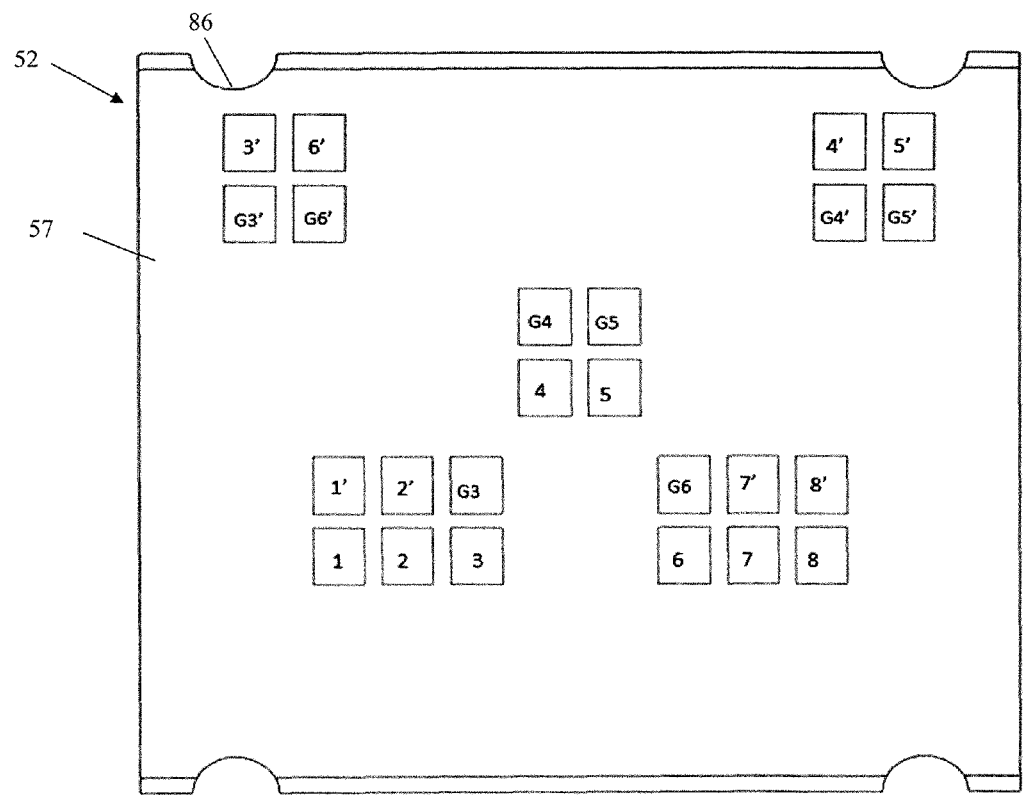
FIG. 3 depicts a front surface of a Printed Circuit Board (PCB) of the jack depicted in FIG. 2 in a structured cabling communication system, in accordance with one embodiment of the present invention.
Figure 4:
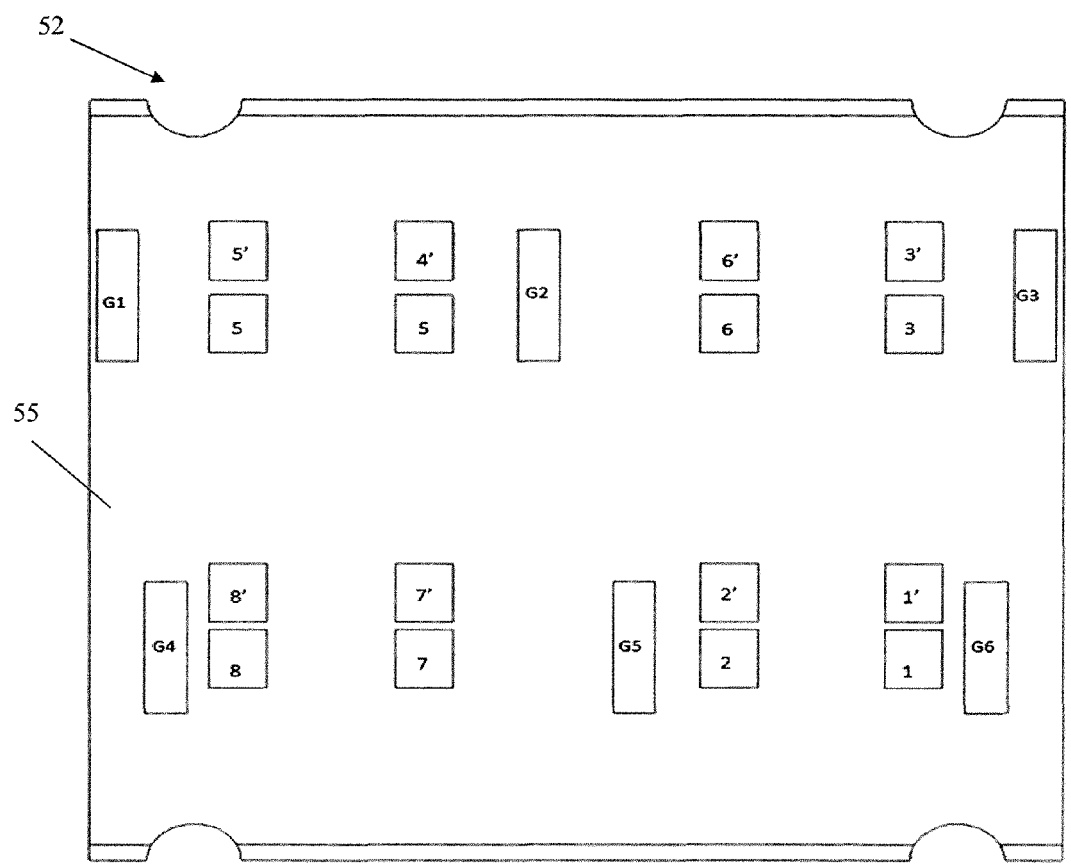
FIG. 4 depicts a rear surface of a Printed Circuit Board (PCB) of the jack depicted in FIG. 2 in a structured cabling communication system, in accordance with one embodiment of the present invention.
Figure 5:
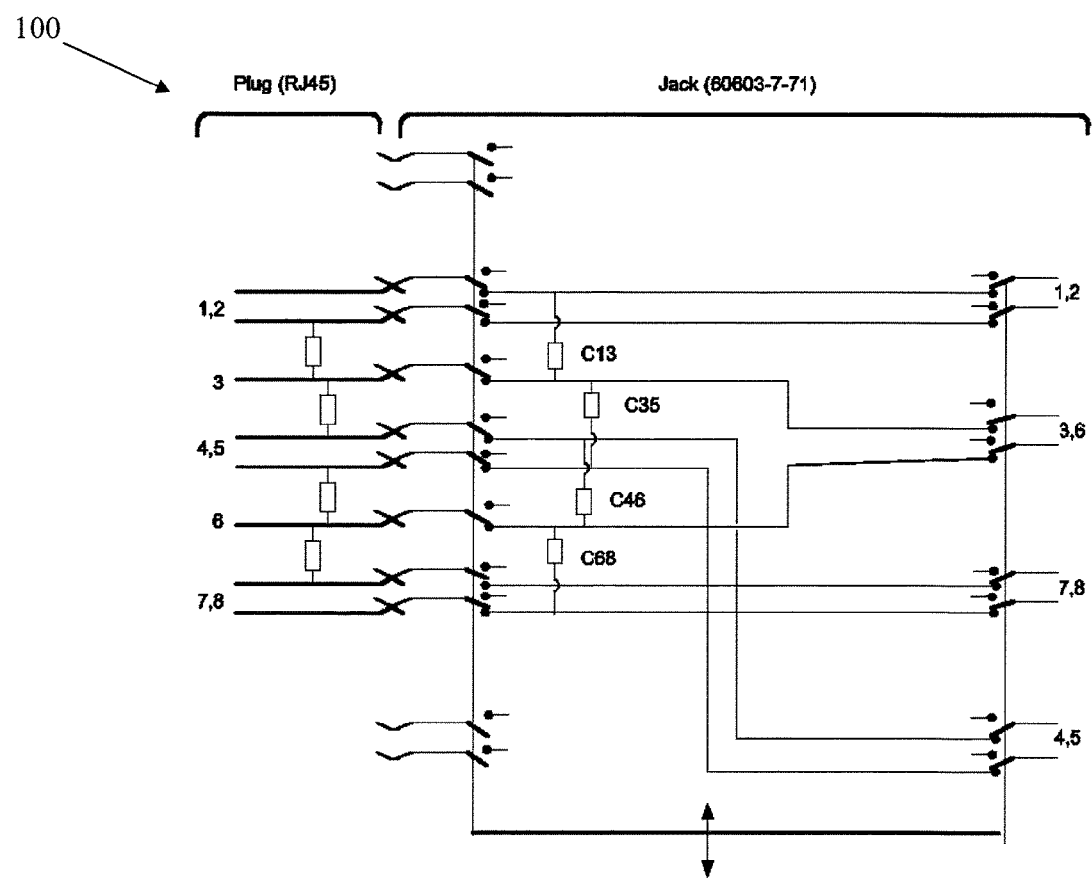
FIG. 5 depicts schematics of a switchable circuit connection based on the type of plug inserted into a jack which is utilized during RJ45 mode of operation and which connects the contact pads 1 through 8 on the rear surface of the PCB depicted in FIG. 4 to separate contact pads 1 through 8 on the front surface of the PCB depicted in FIG. 3, in accordance with one embodiment of the present invention.
Figure 6:
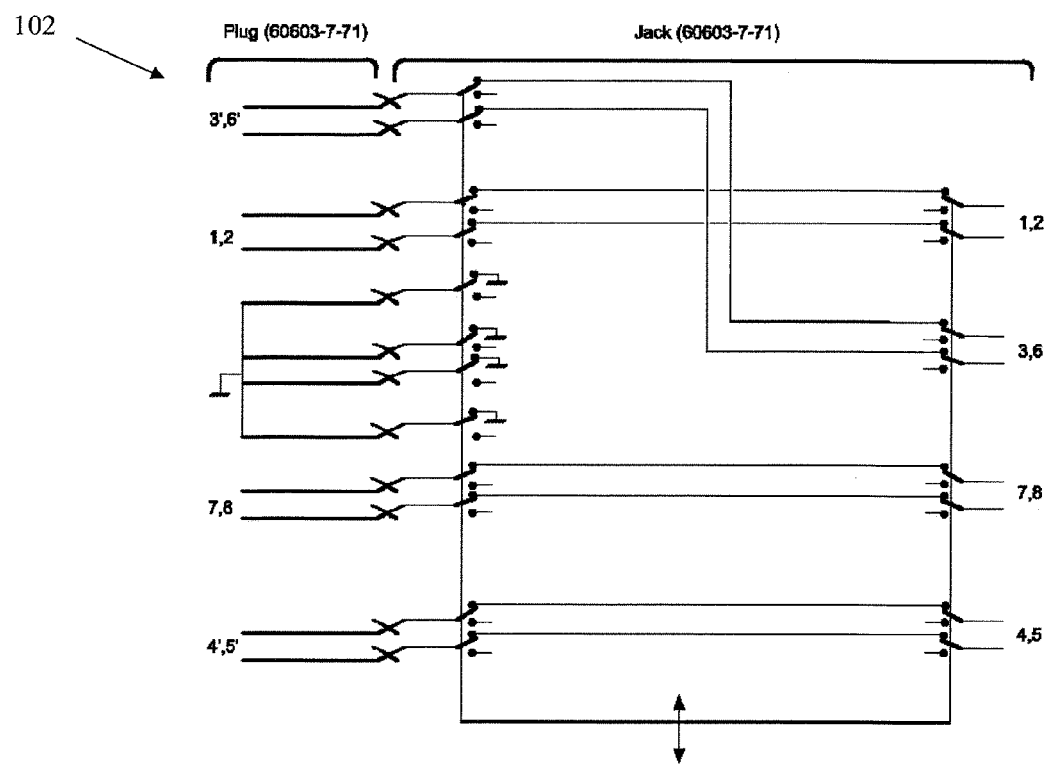
FIG. 6 depicts schematics of a switchable circuit connection based on the type of plug inserted into a jack which is utilized during ARJ45 mode of operation and which is utilized when an IEC 60603-7-71 plug is inserted into the jack and connects the contact pads 1' through 8' on a rear surface 55 of the PCB depicted in FIG. 4 to separate contact pads 1' through 8' on the front surface of the PCB depicted in FIG. 3, in accordance with one embodiment of the present invention.
Figure 13:
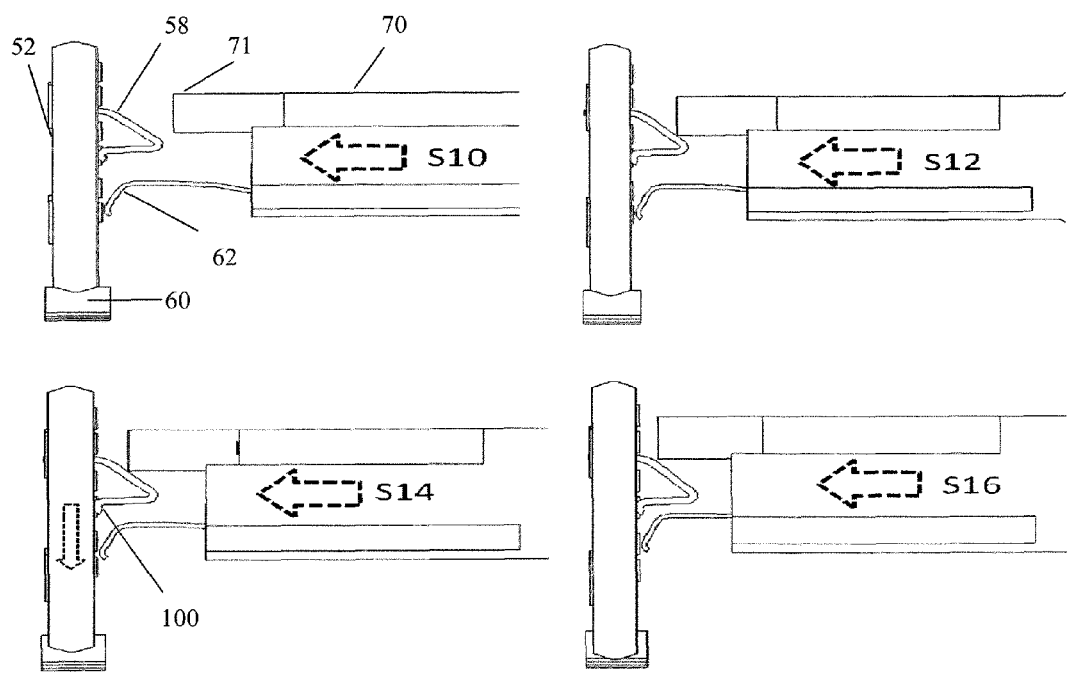
FIG. 13 depicts a side view of an insertion of an IEC 60603-7-71 style plug into the jack depicted in FIG. 2, in accordance with one embodiment of the present invention.

With reference to FIGS. 7 and 13, the switching mechanism is activated during the insertion of an IEC 60603-7-71 plug 70 by the nose feature 71 in front of an IEC 60603-7-71 plug. Insertion of plug 70 causes PCB 52 to slide, which switches the signal path between the plug contacts through the PICs 61, 62, 63 in the jack 44 to one of two different circuits 100, 102 on the PCB 52. Schematics in FIG. 5 and FIG. 6 show switchable circuit connections based on the type of plug, either 46 or 70, inserted into the jack 44. With reference to FIG. 5, one circuit 100 which is utilized during RJ45 mode of operation, when plug 46 is inserted into jack 44, connects contact pads 1 through 8 on the rear surface 55 of the PCB 52, as shown in FIG. 4, to separate contact pads 1 through 8 on a front surface 57 of the PCB 52, as shown in FIG. 3. With reference to FIG. 6, a second circuit 102 on PCB 52 is utilized when an IEC 60603-7-71 plug 70 is inserted into jack 44, and connects contact pads 1' through 8' on the rear surface 55 of PCB 52, as shown in FIG. 4, to separate contact pads 1' through 8' on the front surface 57 of PCB 52, as shown in FIG. 3. With reference to FIG. 2, IDCs 64 provide a means for terminating a twisted pair cable to jack 44 and are held in position by a fixed rear dielectric frame 56 to maintain the alignment with the PCB 52. Connection to the rear side of PCB 52 is made by plated through holes or vias which are connected by traces to the contact pads, as shown in FIG. 4. On the rear side of PCB 52, additional contact pads which are connected by traces to the appropriate vias are positioned to align with eight IDCs 64. There is no common point of connection between any of the contact pads in the two independent circuits 100, 102. Ground pads 3G', 4G', 5G', and 6G' are located on the rear surface 55 of PCB 52 to ground the unused PICs 63 (3', 4', 5', and 6') during the RJ45 mode of operation. Ground pads 3G, 4G, 5G, and 6G, are located on the rear surface 55 of the PCB 52 to ground the unused PICs (3, 4, 5, and 6) during the IEC 60603-7-71 mode of operation. Grounding pads on the front surface 57 of the PCB 52 provide a way of grounding metal divider 66, 67 during either mode of operation.

By using two completely independent circuits 100, 102 which are isolated from each other to connect the appropriate plug contacts from either plug 46 or plug 70 to the IDCs 64, the compensation circuitry required during the RJ45 mode of operation does not impact the electrical performance of jack 44 while operating in the IEC 60603-7-71 mode. This isolation of each circuit 100, 102 is advantageous when meeting the high bandwidth performance targets of jack 44. By using two independent circuits 100, 102, coupled with a sliding action of PCB 52 during switching, IDCs 64 come into contact with separate sets of contact pads 1-8, 1'-8' devoted for RJ45 plug 46 and IEC 60603-7-71 plug 70, respectively.

With reference to FIG. 2, PICs (61, 62 and 63), IDCs (64) and metal dividers (66, 67) are designed to have spring characteristics 90, 92, 94, 96, 98 in their foot ends such that they have a constant force on the contact pads while having wiping contact with the sliding PCB 52. PICs 61 engage PCB 52 in a different location and orientation than PICs 62. This arrangement of PICs 61 relative to PICs 62 helps to minimize any additional crosstalk in the jack between pairs 36 and 45 when operating in RJ45 mode.

Figure 8:
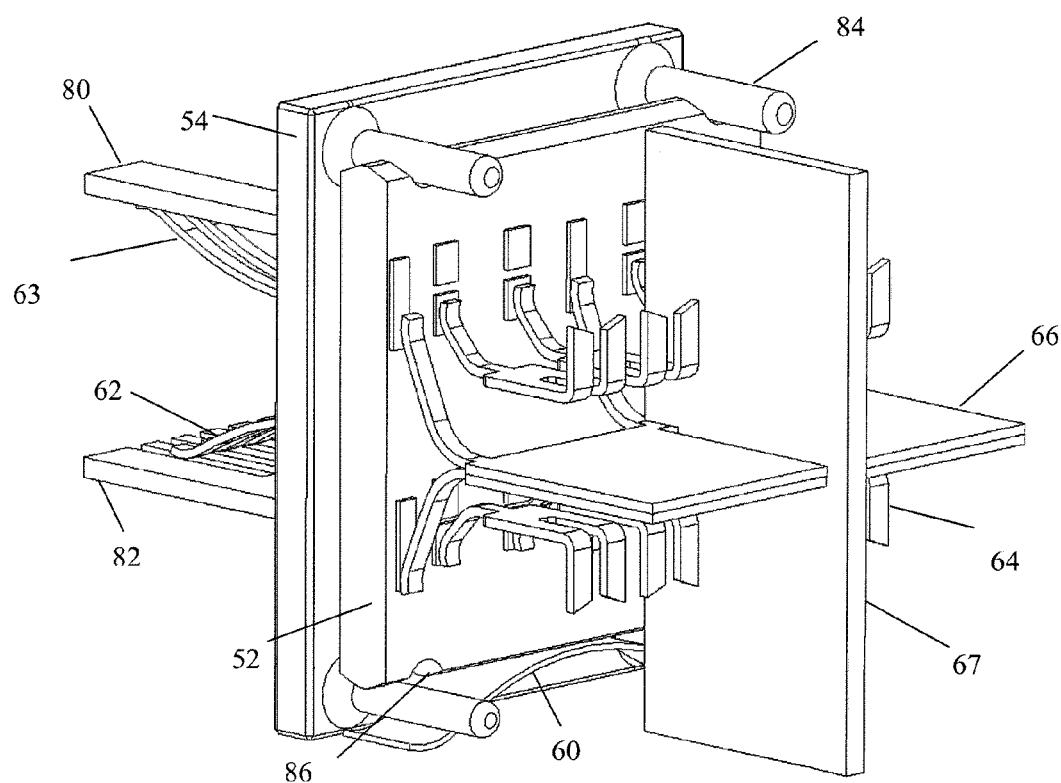
FIG. 8 depicts a rear perspective view of a portion of the jack depicted in FIG. 2 having metallic dividers grounded to the PCB in order to establish continuity between a cable shield and an individual pair shield, in accordance with one embodiment of the present invention.
Figure 9:
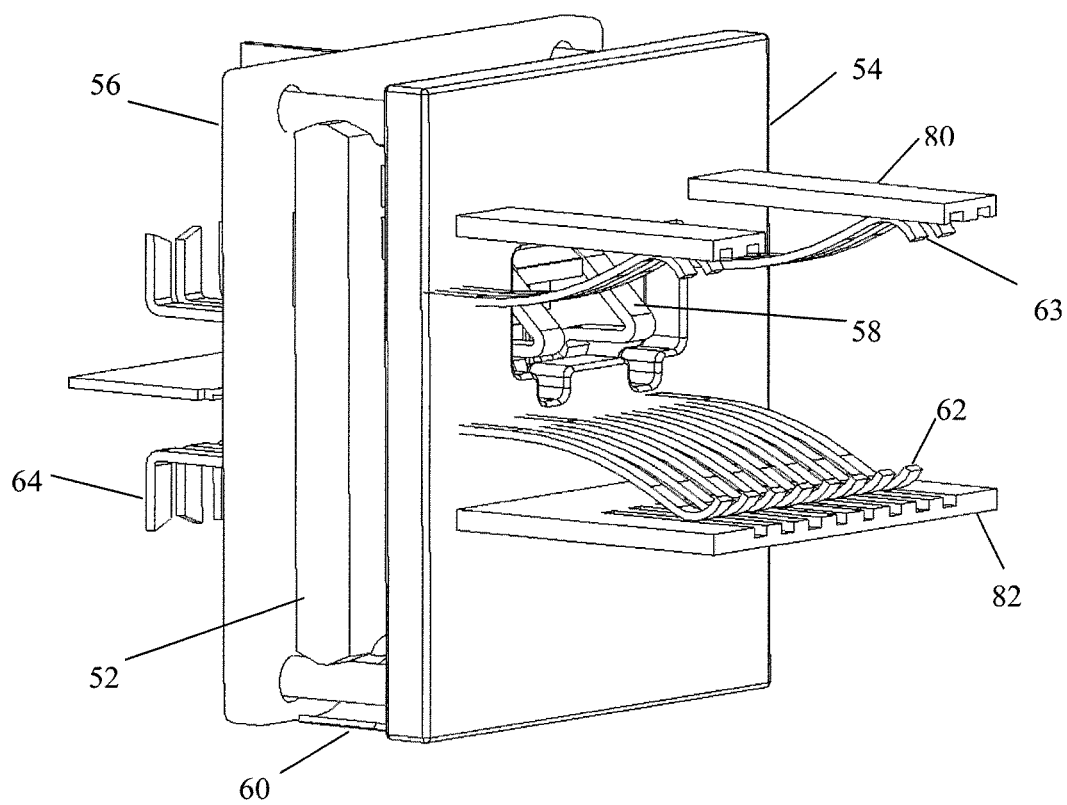
FIG. 9 depicts a front perspective view of a portion of the jack depicted in FIG. 2, in accordance with one embodiment of the present invention.

In order to maintain isolation between the four signal pairs and prevent unwanted crosstalk between IDCs 64 and wire pairs, horizontal 66 and vertical metallic dividers 67 are assembled and positioned between the four pairs of IDCs 64. This arrangement of metallic dividers 66, 67 enables the formation of a quadrant for each pair of wires. Metallic dividers 66, 67 also provide a way to ground the individual metal foil shields that are wrapped around each of the four wire pairs. With reference to FIG. 8, by grounding the metallic dividers 66, 67 to PCB 52, the continuity of the cable shield and individual pair shield can be established. The entire assembly is inserted into a metallic jack housing 68 which also helps maintain the continuity of the shields from cable to cable throughout the mated jack and plug connectivity.

Figure 10:
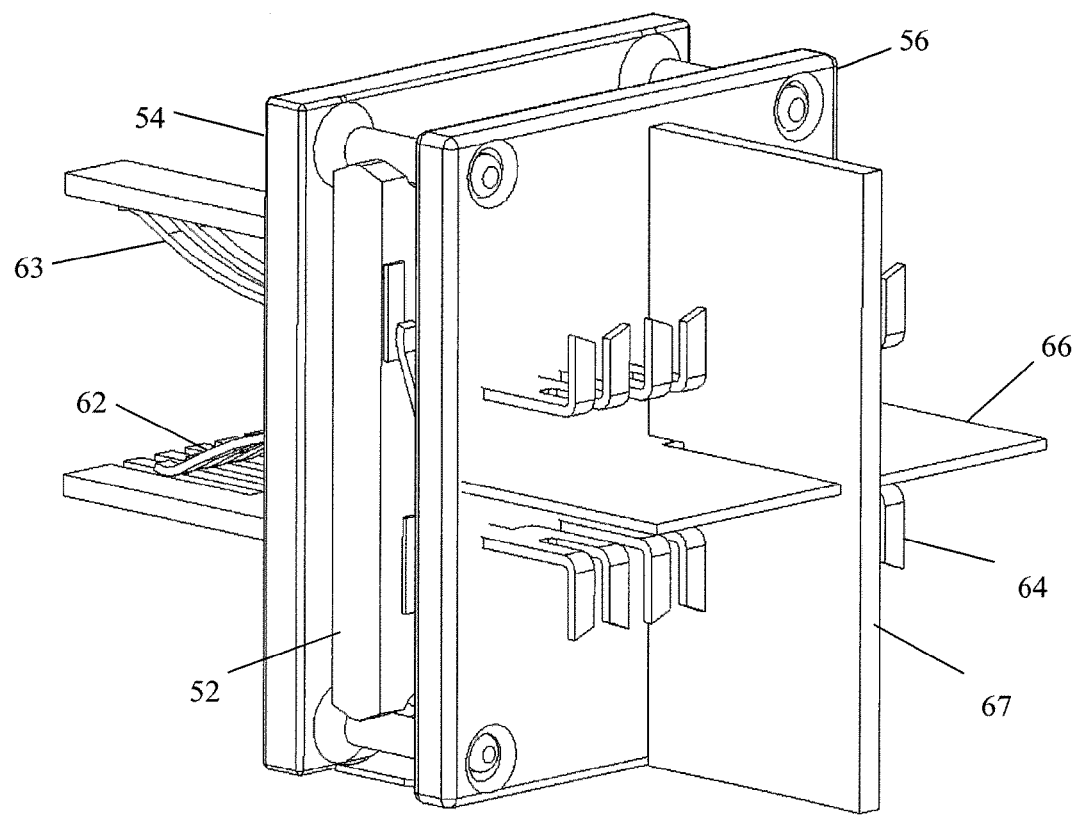
FIG. 10 depicts a rear perspective view of a portion of the jack depicted in FIG. 2 having the PCB sandwiched between a rear dielectric frame connected with a front dielectric frame, in accordance with one embodiment of the present invention.
Figure 11:
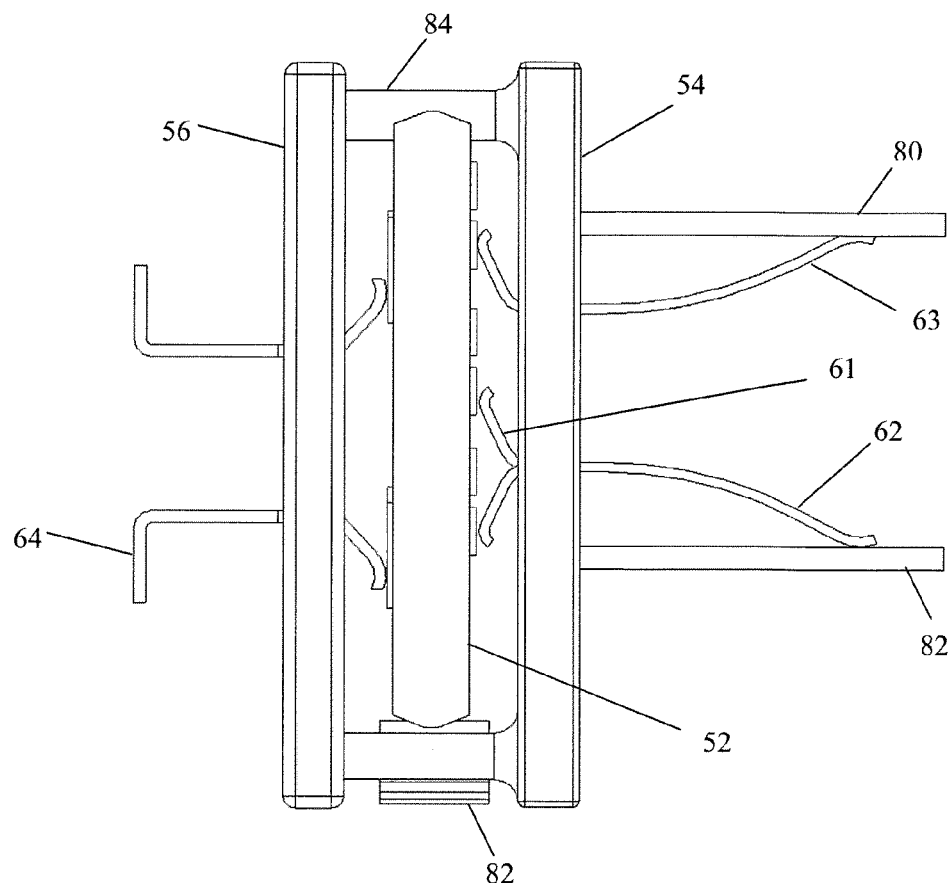
FIG. 11 depicts a side view of a portion of the jack depicted in FIG. 2 having the PCB sandwiched between a rear dielectric frame connected with a front dielectric frame, in accordance with one embodiment of the present invention.

With reference to FIGS. 9-12, during operation, when there is no plug inserted into jack 44 ("idle state"), spring element 60 forces PCB 52 upward until the PCB 52's alignment features 86 engage their corresponding locating features 84, 88 on dielectric frames 54, 56. With the PCB 52 in this position, contact pads 1 through 8 on the front side of PCB 52 are in alignment with the fixed PICs (61, 62) 1 through 8. In addition, the IDC contact pads 1 through 8, on the rear side of PCB 52, are in alignment with the fixed IDCs (64) 1 through 8 as shown in FIGS. 10 and 11. While in this idle state, the eight RJ45 contacts 61, 62 are connected to the 8 IDCs 64 through PCB 52.

Figure 12:
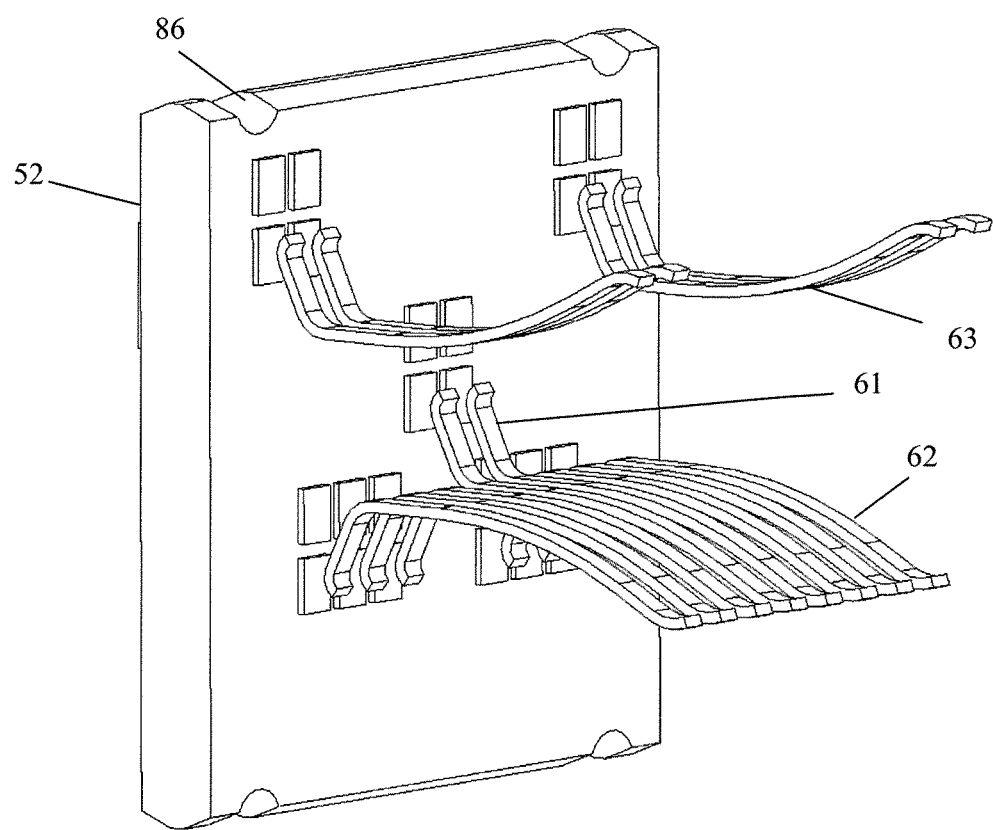
FIG. 12 depicts conductors of the jack depicted in FIG. 2 grounded on the PCB through appropriately placed ground pads on the front side of the PCB, in accordance with one embodiment of the present invention.

When an RJ45 plug 46 is inserted into jack 44 as illustrated in FIG. 11, the switching mechanism is not activated. The plug contacts engage the fixed contacts (61, 62) 1 through 8 in jack 44 and thereby establish continuity between the plug 46 and the cable terminated in the IDCs 64 on the other end of jack 44. As is typical in RJ45 jacks, such as CAT6A, crosstalk compensation is required to counteract the inherent crosstalk that exists in an RJ45 plug. This compensation circuitry, which may include discrete and/or distributed capacitive and inductive elements between conductors, such as C13, C35, C46 and C68, shown schematically in FIG. 5, can be realized on internal and/or external layers of PCB 52. Other compensation elements can also be included which help optimize return loss, far-end crosstalk (FEXT), balance, etc. While jack 44 is engaged with an RJ45 plug 46, PCB 52 is positioned in a way to provide continuity between the eight RJ45 plug contacts 61, 62 and the eight IDCs 64 terminating the cable conductors. The other fixed PICs 63, 3', 4', 5', and 6' can introduce unintended coupling and crosstalk between pairs in jack 44. To prevent this unintended coupling and crosstalk from occurring, these conductors 63 are grounded on PCB 52 through appropriately placed ground pads on the front side of the PCB 52 as shown in FIG. 12.

With reference to FIG. 13, when an IEC 60603-7-71 style plug 70 is inserted into jack 44, the nose feature 71 on the front of the plug engages PCB slider 58 mounted to PCB 52. As plug 70 is inserted further into jack 44, nose feature 71 applies force and displacement against the angled face of slider 58. Slider 58 transfers the displacement to PCB 52 based on the incline of slider 58. In this design, displacement of PCB 52 is converted to the Y direction due to the constraints provided by the dielectric frames (54 and 56) along a horizontal direction. As a result, while the PCB 52 moves in a downward direction with the insertion of nose feature 71, a bottom surface of the PCB 52 pushes against the spring 60. When the vertical component of the force from PCB 52 is greater than the spring force, the PCB 52 slides downward deflecting spring element 60 until the plug 70 is inserted into its final position. This action is illustrated in FIG. 13 with steps S10 (plug approach), S12 (initial plug contact), S14 (sliding action of PCB 52) and S16 (final engaged position). Slider 58 is designed in such a way that it transfers the displacement to PCB 52 while also having spring-like characteristics 100 to accommodate some tolerances of the parts and motion once the required vertical displacement has occurred.

Figure 14:
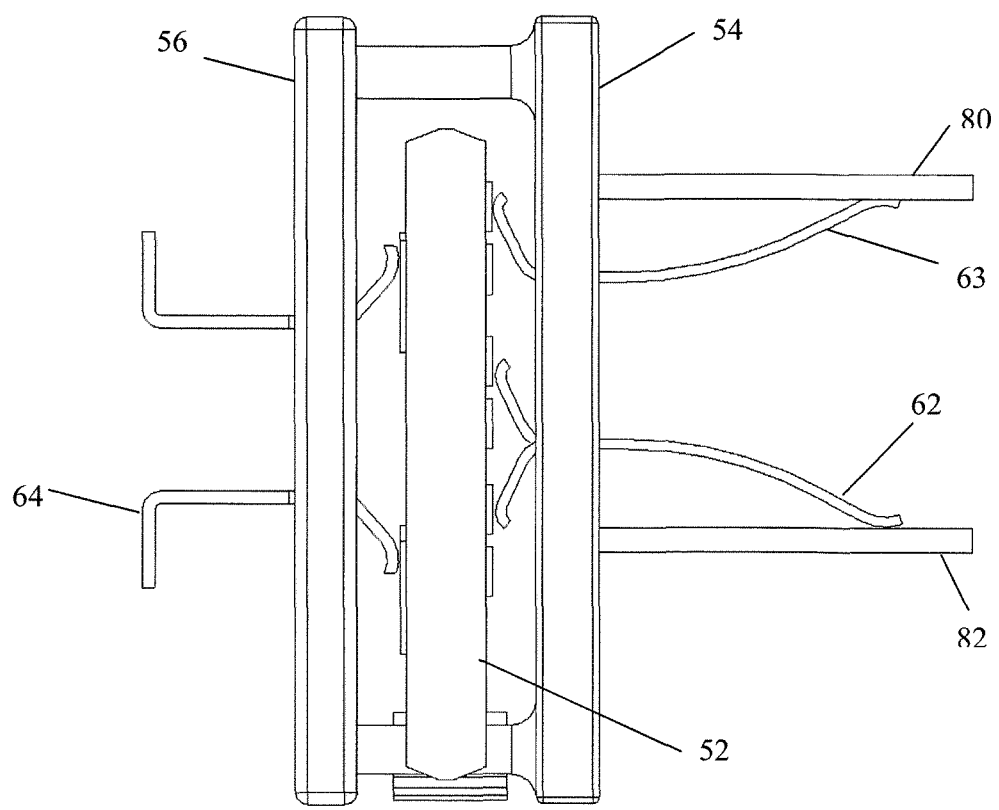
FIG. 14 depicts a side view of a portion of the jack depicted in FIG. 2 having the PCB sandwiched between a rear dielectric frame connected with a front dielectric frame upon insertion of an IEC 60603-7-71 style plug into the jack, in accordance with one embodiment of the present invention.
Figure 15:
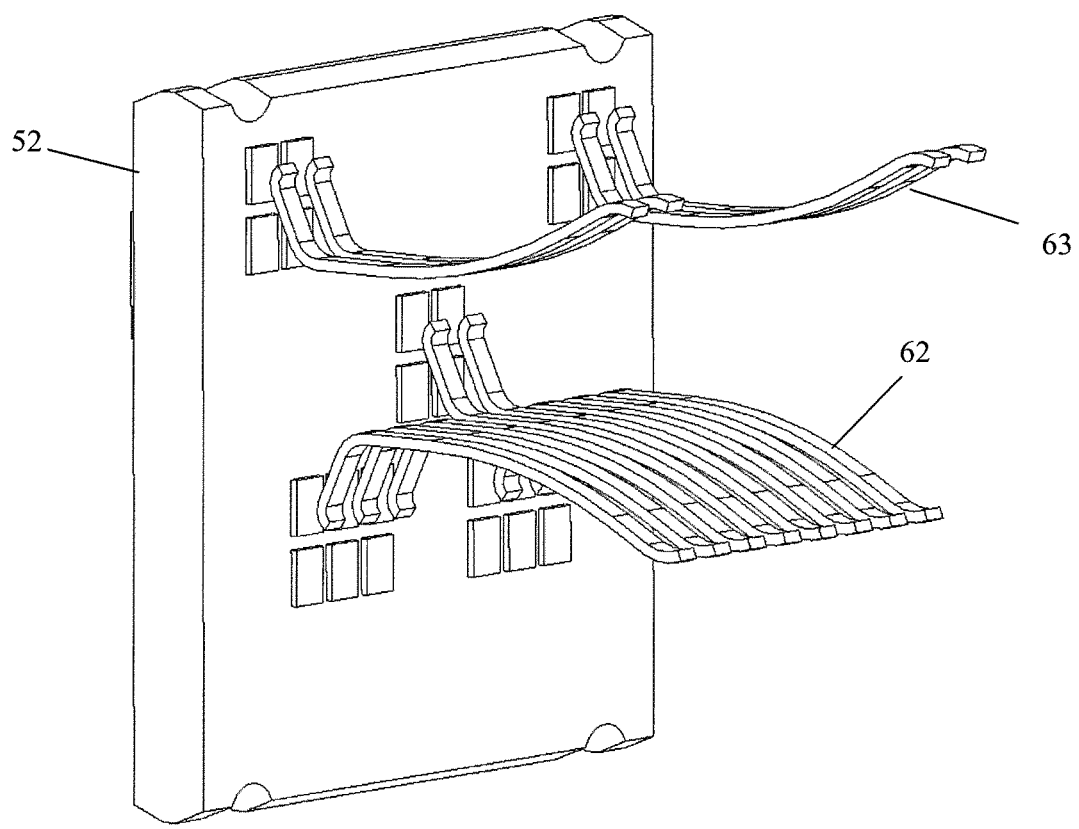
FIG. 15 depicts a perspective view of a front surface of the PCB of the jack depicted in FIG. 2 upon insertion of an IEC 60603-7-71 style plug into the jack, in accordance with one embodiment of the present invention.

With reference to FIGS. 14 and 15, the twelve fixed PICs (61, 62 and 63) engaging the front of the PCB 52 and the eight fixed IDC contacts 64 engaging the back of the PCB 52 will be disconnected from the RJ45 contact pads as the PCB 52 is forced to slide downward. Once the plug has been fully inserted, the PCB 52 slides downward to its final position. In this position, the twelve PICs and eight fixed IDCs will now be aligned with different contact pads on the front and back side of the PCB 52 which can be seen in FIG. 14 and FIG. 15. PICs 61, 62, 63 slide off and on their respective contact pads as the PCB 52 moves. In the process of sliding on and off the contact pads of the PCB 52, any contaminants or oxidation that may be present on the surface of the PCB 52 contact pads will be wiped away; thereby, ensuring a robust gas tight connection between the PICs 61, 62, 63, IDCs 64, and the PCB 52.

By connecting all twelve fixed PICs 61, 62, 63 and eight fixed IDCs 64 to new contact pads in the IEC 60603-7-71 mode of operation, all of the compensation circuitry on the PCB 52 that was necessary for the RJ45 mode of operation is completely disconnected from the signal path on all four signal pairs. In addition, PICs 3, 4, 5, and 6 are connected to ground pads on the front side of PCB 52. Grounding the unused PICs 3, 4, 5, and 6 is advantageous in achieving sufficient return loss, insertion loss, and electrical balance performance at higher frequencies.

Figure 16:
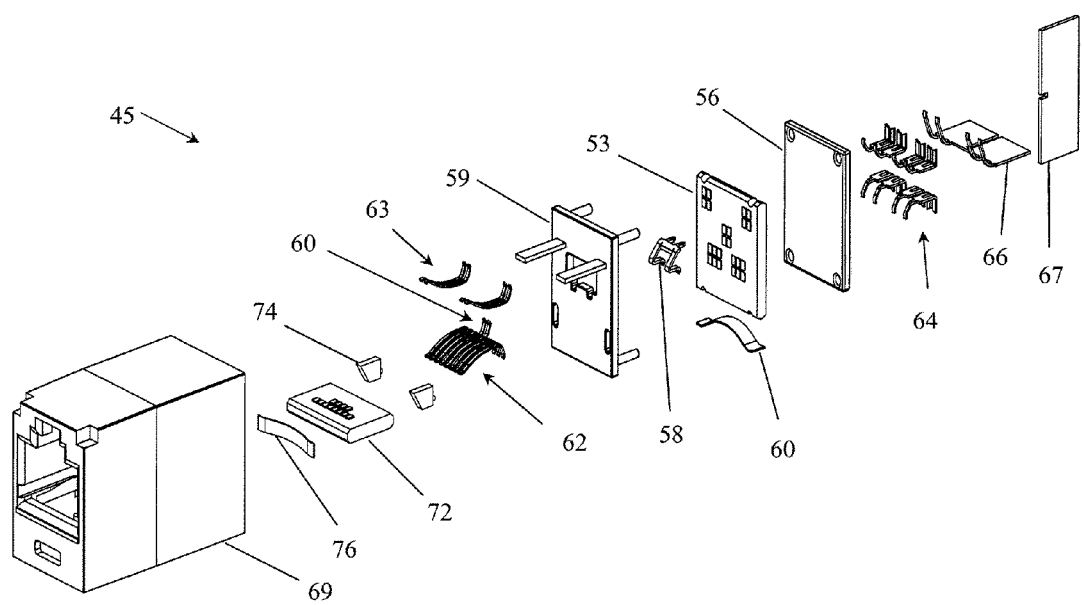
FIG. 16 depicts an exploded perspective view of a jack in a structured cabling communication system, in accordance with one embodiment of the present invention.

With reference to FIG. 16, in accordance with one embodiment, a second jack 45 includes a provision for two stage compensation. It may be necessary to implement two stages of circuitry to sufficiently compensate for the RJ45 plug's crosstalk over a wide enough bandwidth. For example, CAT6A standards specify crosstalk requirements up to a frequency of 500 MHz. In the event where two stages of compensation are required, a second PCB 72 can be incorporated in a horizontal configuration. FIG. 16 depicts an exploded view of jack 45 with a vertical PCB 53, front dielectric frame 59, rear dielectric frame 56, vertical PCB metal slider 58, vertical spring 60, PICs 1-8 (PICs 61, 62), PICs (3', 4', 5', 6') 63, IDC 64, horizontal metal divider 66, vertical metal divider 67 and metal jack housing 68, dielectric sliders 74, jack housing 69, horizontal PCB 72 and horizontal spring 76.

Figure 17:
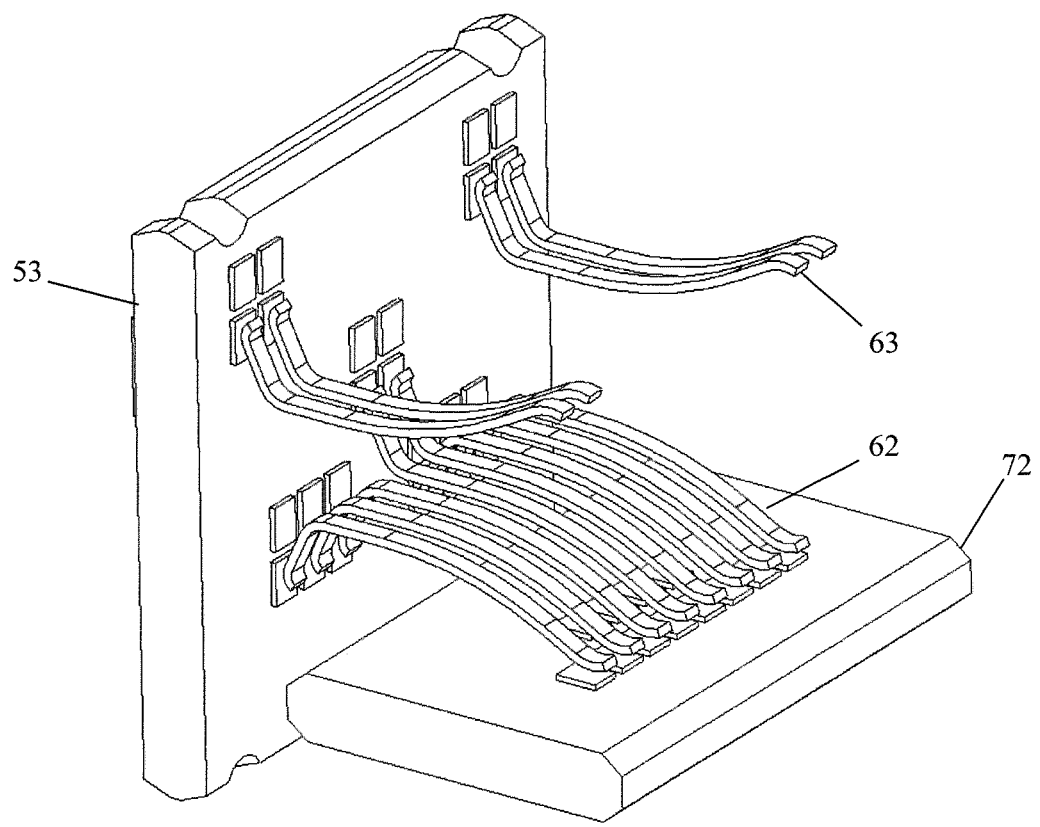
FIG. 17 depicts a perspective view of a front surface of a first PCB of the jack depicted in FIG. 16 having a second PCB in a first position, in accordance with one embodiment of the present invention.

During operation of jack 45, the first stage of compensation circuitry can be located on PCB 72 while the second compensation stage can be located on the PCB 53. A spring element 76 forces the PCB 72 into the appropriate position (for RJ45 plug 46 interface) to align the fixed PICs (61, 62) 1 through 8 with the corresponding contact pads on the top side of PCB 72 as shown in FIG. 17. The appropriate compensation circuitry, which may include discrete and/or distributed capacitive and inductive elements between conductors, can be realized on internal and/or external layers of the PCB 72 as shown in FIG. 18.

Figure 18:
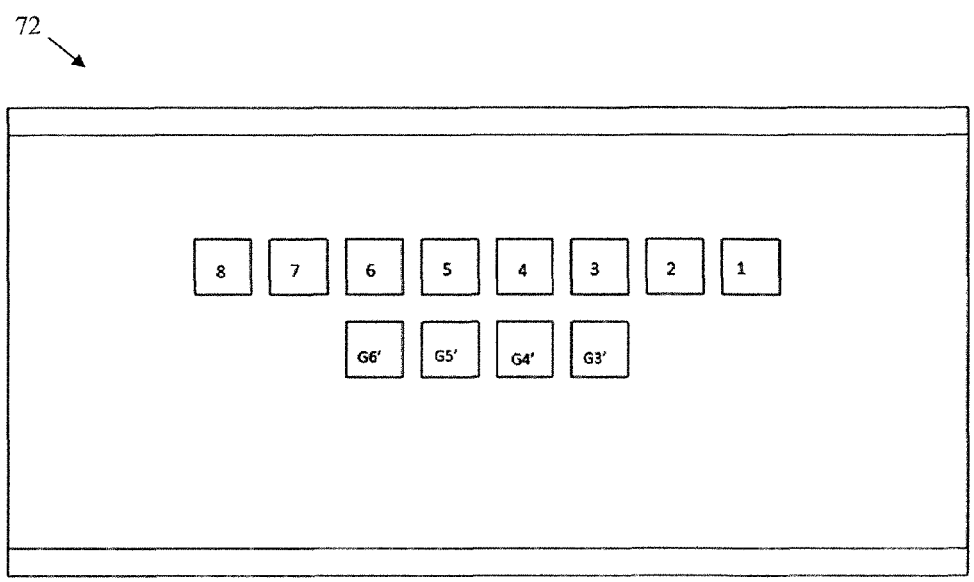
FIG. 18 depicts a top surface of a second Printed Circuit Board (PCB) of the jack depicted in FIG. 16 in a structured cabling communication system, in accordance with one embodiment of the present invention.
Figure 19:
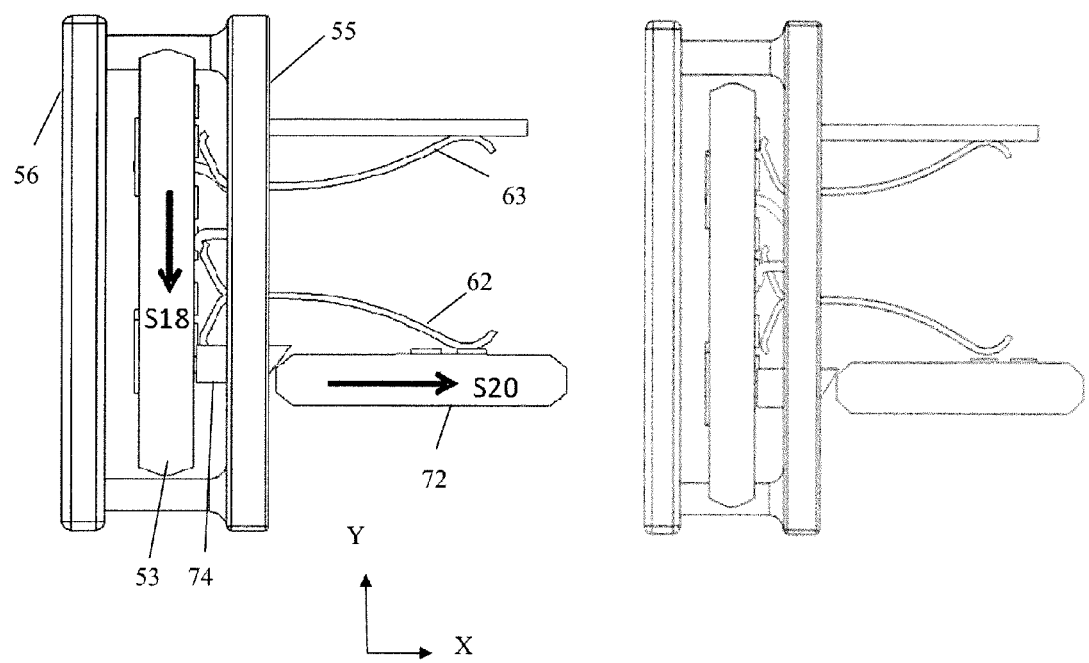
FIG. 19 depicts a side view of an insertion of an IEC 60603-7-71 style plug into the jack depicted in FIG. 16, in accordance with one embodiment of the present invention.

With reference to FIGS. 17-19, if two stages of compensation are required in the RJ45 mode of operation via PCB 72 and PCB 53, both stages of compensation circuitry need to be disconnected from all four signal pairs. To achieve this disconnection of compensation circuitry, the connection of the fixed PICs to PCB 72 must be changed for the IEC 60603-7-71 mode of operation.

Figure 20:
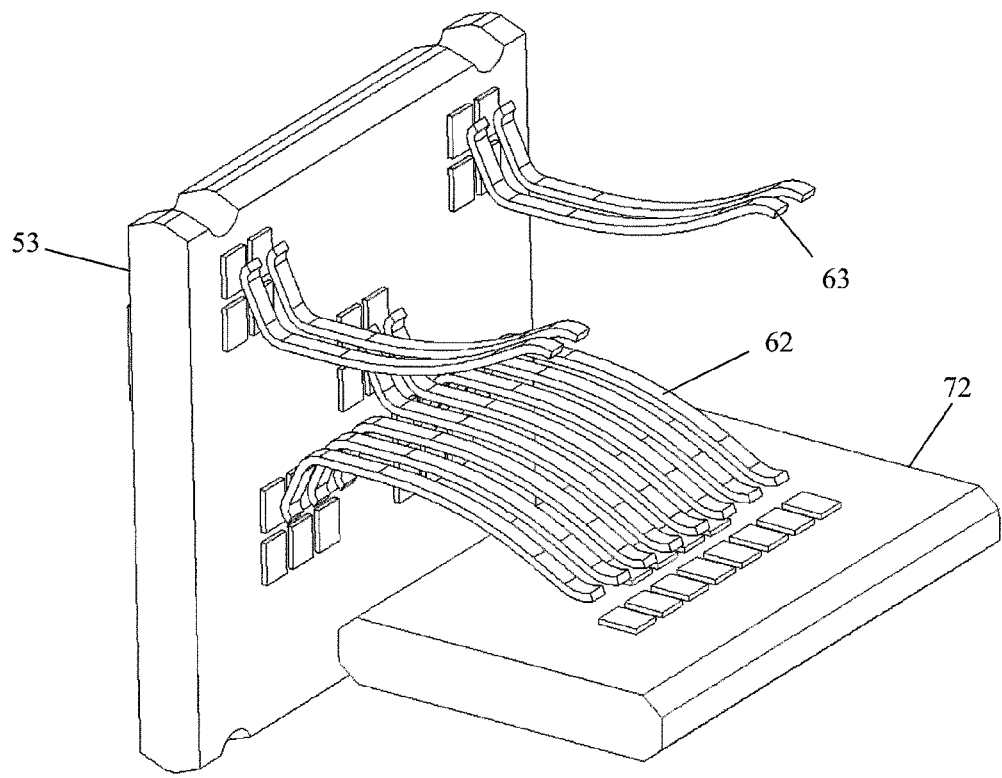
FIG. 20 depicts a perspective view of a front surface of a first PCB of the jack depicted in FIG. 16 having a second PCB in a second position, in accordance with one embodiment of the present invention.
Figure 21:
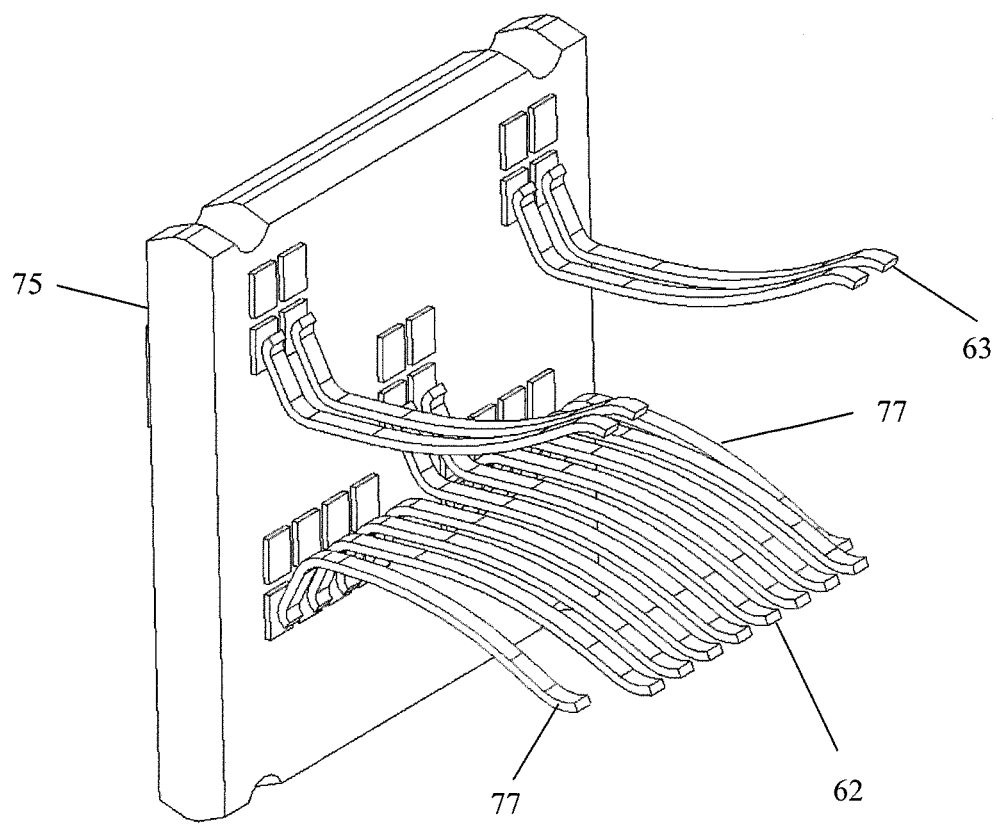
FIG. 21 depicts a perspective view of a front surface of a first PCB of the jack depicted in FIG. 16 in a first position, in accordance with one embodiment of the present invention.
Figure 22:
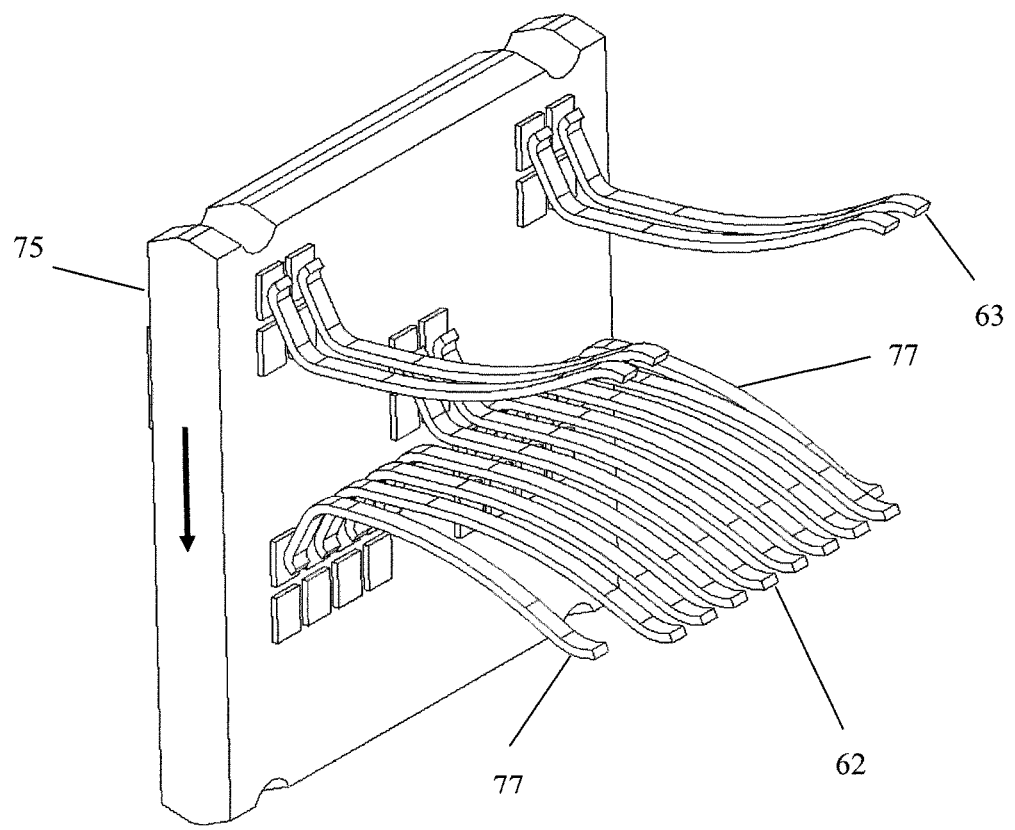
FIG. 22 depicts a perspective view of a front surface of a first PCB of the jack depicted in FIG. 16 in a second position, in accordance with one embodiment of the present invention.
Figure 23:
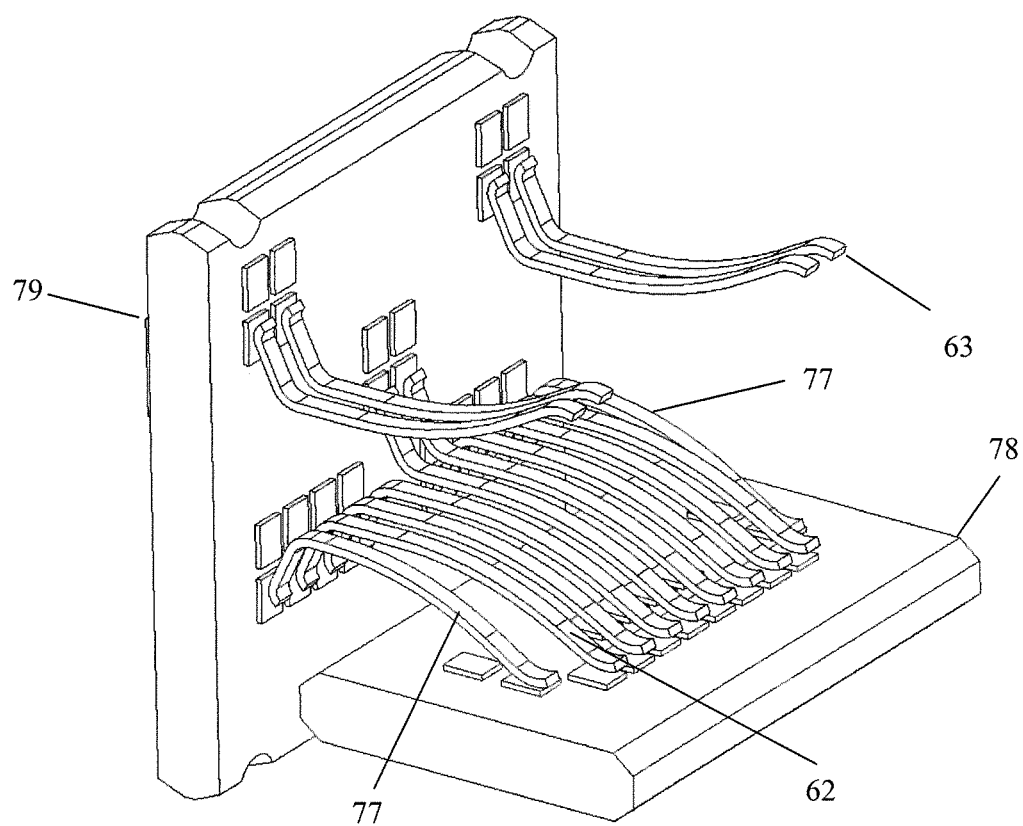
FIG. 23 depicts a perspective view of a front surface of a first PCB of the jack depicted in FIG. 16 having one alternative version of a second PCB in a first position, in accordance with one embodiment of the present invention.
Figure 24:
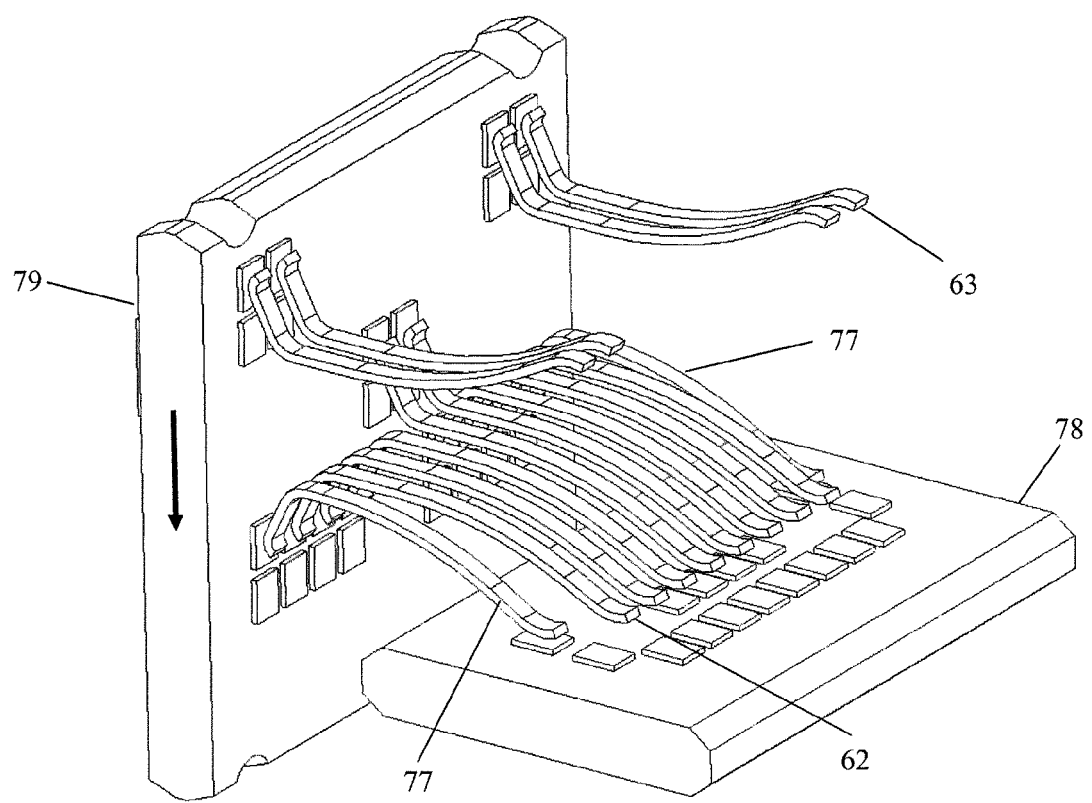
FIG. 24 depicts a perspective view of a front surface of a first PCB of the jack depicted in FIG. 16 having one alternative version of a second PCB in a second position, in accordance with one embodiment of the present invention.

With reference to FIG. 16 and FIG. 19, two dielectric sliders 74 which are mounted to PCB 53 are designed to engage PCB 72 as the PCB 53 is forced to slide downward when an IEC 60603-7-71 plug 70 is inserted. The PCB 72 is constrained from moving in Y-direction with the only degree in Z-direction with a spring element 76 resisting motion along Z-direction. As plug 70 is inserted, PCB 53 is forced to slide downward (S18) which causes the dielectric sliders 74 to apply force and displacement on PCB 72. Due to the sloped nature of dielectric sliders 74 and constraints in Y-direction for PCB 72, downward displacement of PCB 53 (S18) is translated into Z-direction against the spring 76. When this horizontal force is greater than the opposing force of the spring element 76, PCB 72 slides laterally (S20) compressing the spring element 76 until the plug 70 is inserted into its final position. Eight PICs 61, 62 engaging the top surface of the PCB 72 will be disconnected from their corresponding RJ45 contact pads as PCB 72 is forced to slide laterally. Once the plug 70 has been fully inserted into the jack 45, PCB 72 will have slid laterally to its final position. In this position, eight PICs 61, 62 will now be aligned with different contact pads on the top side of PCB 72. PICs 1, 2, 7, and 8 will now have no connection to the compensation circuitry on PCB 72, and PICs 3, 4, 5, and 6 will now be connected to ground pads on the top side of PCB 72 as shown in FIG. 20. These signal grounding pads are advantageous in achieving sufficient return loss, insertion loss, and electrical balance performance at higher frequencies.

The sliding action of the PCBs 53, 72, which is activated by the nose feature 71 on the front of an IEC 60603-7-71 plug 70, essentially switches the signal path through the mated connectivity between two different circuits on the PCBs 53, 72. FIG. 6 shows schematically the switchable circuit connections when IEC 60603-7-71 plug 70 is inserted into the jack.

Two additional embodiments according to the present invention are shown in FIGS. 21-24. In one embodiment shown in FIG. 21 (RJ45 mode) and FIG. 22 (IEC 60603-7-71 mode) PCB 75 can substitute for PCB 52 in jack 44, with the additional contacts 77 (0 and 9 contacts). In another embodiment shown in FIG. 23 (RJ45 mode) and FIG. 24 (IEC 60603-7-71 mode) PCB 79 can substitute for PCB 53 in jack 45, and PCB 78 can substitute for PCB 72 in jack 45, with the additional contacts 77 (0 and 9 contacts). Embodiments shown in FIGS. 21-24 can improve the electrical performance of the jacks 44, 45 according to the present invention, and more particularly additional contacts 77 (0 and 9 contacts), when either jack 44 or 45 is operating in IEC 60603-7-71 mode.

In the embodiments shown in FIGS. 21-24, when operating in IEC 60603-7-71 mode, PICs (62) 1 and 2 are mated with their corresponding contacts on the IEC 60603-7-71 plug and PIC 3 is connected to ground. With the position of PIC 3 being adjacent to PIC 2, an impedance discontinuity is created. Even and odd mode impedance of PIC 1 is inherently higher than PIC 2. This impedance discontinuity results in an increase in electrical reflections at this interface and an increase in mode conversion. The differential return loss, insertion loss, and crosstalk performance of pair 12 will all be degraded due to this inherent condition of the jack. To avoid these performance degradations, even and odd mode impedances of PICs 1 and 2 should be equal and matched to the characteristic impedance of the cable. By introducing contact 0 (77), which is grounded in the IEC 60603-7-71 mode of operation, adjacent to PIC 1 (62) the impedances will be equal. This provides a balanced configuration of ground conductors and signal conductors (G-S-S-G), and this balanced transmission line configuration becomes more advantageous relative to signal integrity as the bandwidth increases.

A similar concern exists with PICs 7 and 8 in IEC 60603-7-71 mode of operation. PICs 7 and 8 are mated with their corresponding plug contacts and PIC 6 is grounded. With PIC 6 being adjacent to PIC 7, even and odd mode impedance of PIC 8 will be inherently higher than PIC 7. By adding an additional grounded contact 9 (77) adjacent to PIC 8 (62), a balanced G-S-S-G configuration is created and performance degradations are avoided or minimized. Contacts 0 and 9 (77) are grounded through contact pads on the PCB 75 for embodiment 3 when PCB 75 slides downward on plug 70 insertion; and contacts 0 and 9 (77) are grounded through contact pads on the PCBs 79, 78 for embodiment 4 when PCB 79 slides downward on plug 70 insertion. The fixed position of contacts 77 (0 and 9) are slightly offset relative to PICs 1 through 8 to allow the plug body to be fully inserted without interfering with the 0 and 9 contacts 77. Without this offset, the solid portion of the plug body would interfere with and deform the shape of the PICs. The plug body can also be beneficially modified to shield the 0 and 9 contacts 77.

Another possible use of contacts 77 (0 and 9) is to incorporate them into the crosstalk compensation circuitry required when jacks 44 or 45 are operating in the RJ45 mode. They may provide an additional way of minimizing the super-pair affect caused by the split of pair 36 coupling to pair 12 and pair 78.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

What is claimed:

1. A communication jack for connecting to a first plug and a second plug, said jack comprising:
   a housing including a plug receiving aperture;
   a first plurality of plug interface contacts in said plug receiving aperture for connection to said first plug, a subset of said first plurality of contacts also for connection to said second plug;
   a second plurality of plug interface contacts in said plug receiving aperture also for connection to said second plug, said second plurality of plug interface contacts different from said first plurality of plug interface contacts;

at least one ground contact at least partially within said housing for providing a signal ground for said subset of said first contact pairs when said jack is connected to said second plug, said at least one ground contact separate from said first plurality of plug interface contacts and said second plurality of plug interface contacts; and a circuit board, wherein said circuit board is movable between a first position in which said first circuit engages said first set of plug interface contacts and a second position in which said second circuit engages said second set of plug interface contacts.

2. The communication jack of claim 1 further comprising coupling circuitry having a first circuit which engages said first set of plug interface contacts when said first plug is inserted into said plug receiving aperture and a second circuit which engages said second set of plug interface contacts when said second plug is inserted into said plug receiving aperture.

3. The communication jack of claim 2 wherein said coupling circuitry is on said circuit board.

4. The communication jack of claim 1 further comprising a set of cable connecting contacts, wherein in said first position said first circuit connects said first set of plug interface contacts with said cable connecting contacts, and wherein in said second position said second circuit connects said second set of plug interface contacts with said cable connecting contacts.

5. The communication jack of claim 2, wherein said first circuit is electrically isolated from said second circuit.

6. The communication jack of claim 2, wherein said first circuit is at least partially coupled to said second circuit.

* * * * *